(12) United States Patent
Park et al.

(10) Patent No.: US 7,602,344 B2
(45) Date of Patent: Oct. 13, 2009

(54) PORTABLE TERMINAL WITH VARIABLE GROUND UNIT

(75) Inventors: Jong-Kui Park, Suwon-si (KR);
Dae-Chul Kang, Hwaseong-si (KR);
Hyu-Myung Jeon, Seongnam-si (KR);
Yue-Il Youn, Hwaseong-si (KR);
Seung-Han Seo, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/955,686

(22) Filed: Dec. 13, 2007

(65) Prior Publication Data
US 2008/0143614 A1 Jun. 19, 2008

(30) Foreign Application Priority Data
Dec. 13, 2006 (KR) .................... 10-2006-0126844

(51) Int. Cl.
*H01Q 1/24* (2006.01)
(52) U.S. Cl. .................. 343/702; 343/846; 343/876
(58) Field of Classification Search ............ 343/702, 343/846, 876
See application file for complete search history.

(56) References Cited

U.S. PATENT DOCUMENTS 6,987,486 B2 * 1/2006 Kurjenheimo et al. ...... 343/702

FOREIGN PATENT DOCUMENTS

KR 1020060110561 * 10/2006

OTHER PUBLICATIONS

Je-Min Lee, Wireless telecommunication terminal and method for controlling radiation pattern of antenna, Machine translation by KIPO.*

* cited by examiner

*Primary Examiner*—Anh Q Tran
(74) *Attorney, Agent, or Firm*—The Farrell Law Firm, LLP (57) ABSTRACT

Provided is a portable terminal with a variable ground unit. The portable terminal includes a main board including a ground layer having a predetermined area; at least one antenna radiator placed at the main board; at least one conductor installed or formed in the terminal and spaced apart from the ground layer; at least one switching unit interposed between the at least one conductor and the ground layer, the switching unit selectively connecting the conductor to the ground layer through an electrical connection unit; and a controller controlling the switching unit so that the conductor and the ground layer of the main board are selectively electrically connected depending on a state of the terminal.

20 Claims, 7 Drawing Sheets

PORTABLE TERMINAL WITH VARIABLE GROUND UNIT

PRIORITY

This application claims priority under 35 U.S.C. § 119 to an application filed in the Korean Intellectual Property Office on Dec. 13, 2006 and assigned Serial No. 2006-126844, the contents of which are incorporated herein by reference.

BACKGROUND OF THE INVENTION

1. Field of the Invention

The present invention relates generally to a portable terminal with a ground unit, and in particular, to a portable terminal with a variable ground unit configured to reduce a Specific Absorption Rate (SAR) by achieving an optimum ground area corresponding to an open/closed state of the terminal and a mode change thereof, and to contribute to improving radiation performance of an antenna.

2. Description of the Related Art

As the electronic communications industry is developed, a portable terminal is becoming smaller and slimmer while providing more various functions. For example, a portable terminal is provided with a speaker unit that can implement various melodies and chords, and a color display unit having millions of pixels. Besides a basic communications function, the terminal may provide an MP3 player function, game contents using the display unit, and a Digital Multimedia Broadcast (DMB) function for providing a public broadcasting service.

Various types of terminals are being continuously released to meet users' demands. In general, the terminals may be classified according to how the terminal is opened or closed for a calling function of the terminal. Thus, the terminal may be classified into a basic bar type, a flip type, a folder type, a slide type, a pop-up type, a slide and rotation type.

Each of the aforementioned terminals includes a predetermined ground unit. The ground unit is formed at a main board in general, and may serve as a conductor for electronic function groups installed on the main board, or as a conductor for a smooth operation of an antenna radiator for wireless communications. Also, the ground unit may be extended to shield an electronic wave potentially harmful to the human body.

Since the terminals are used as portable wireless devices, a predetermined antenna is provided to each of the terminals. Various types of antennas are being used for the terminals. Examples of the antennas may include an external antenna unit protruding outside the terminal, and a built-in antenna so-called 'intenna' mounted inside the terminal. The antenna must be disposed at a proper place of the terminal to maximize its performance, depending on the type of opening and closing a sub-body of the terminal. For example, in the folder type terminal and the slide type terminal, a terminal performs its antenna function by an external antenna protruding upwardly from a main body, or by an internal antenna radiator at a predetermined rear surface inside the main body.

However, since the terminals are designed in a stand-off type such that the optimum antenna coupling is performed when the sub-body is opened or closed, or an intermediate radiation characteristic is obtained, thereby resulting in degradation in overall radiation characteristic of the terminal. Also, the radiation characteristic may degrade because of a finger touch occurring when a user grabs the terminal for calling.

Therefore, the terminals include a separate ground unit. For example, in the case of the folder type terminal or the slide type terminal including a hinge module or a slide hinge module that mechanically connects a main body with a folder or a slide body, the hinge module is electrically connected to a ground layer of a main board installed in the main body, thereby expanding a ground layer. This serves to shield an electronic wave, thereby minimizing bad influence of the terminal on the human body.

When the folder or the slide body is opened for a calling operation, the above-mentioned structure, in which a ground layer of the main board of the main body is grounded uniformly with a ground layer of the hinge module or of the hinge module and the sub-body, reduces influence on the human body and improves radiation efficiency of the antenna. However, the radiation efficiency of the antenna degrades on the free space because of the expansion of the ground area.

Also, the terminal includes one or more antennas having integral or individual functions operating within different frequency bands in response to the current tendency of making a terminal cover various bands of, for example, Code Division Multiple Access (CDMA), a Digital Cellular System (DCS), a Personal Communications System (PCS), Digital Multimedia Broadcasting (DMB), and Bluetooth®. The antennas of different bands are different in ground area for the optimum operation.

Therefore, a portable terminal requires a variable ground unit that can perform optimum antenna coupling depending on an opened/closed state of the sub-body, or a corresponding band among multiple bands.

SUMMARY OF THE INVENTION

An aspect of the present invention is to substantially solve at least the above problems and/or disadvantages and to provide at least the advantages below. Accordingly, an aspect of the present invention is to provide a portable terminal with a variable ground unit configured to achieve an optimum antenna radiation characteristic depending on whether a sub-body is opened or closed.

Another aspect of the present invention is to provide a portable terminal with a variable ground unit configured to achieve an optimum antenna radiation characteristic by varying a ground area depending on an applied frequency band.

Still another aspect of the present invention is to provide a portable terminal with a variable ground unit configured to reduce an SAR, which affects the human body, to the maximum intent depending on whether a sub-body is opened or closed.

Further another aspect of the present invention is to provide a portable terminal with a variable ground unit configured to implement a high-end terminal by maintaining optimum terminal performance when the terminal is opened or closed and operates at a corresponding frequency band.

According to one aspect of the present invention, a portable terminal with a variable ground unit includes a main board including a ground layer having a predetermined area; at least one antenna radiator placed at the main board; at least one conductor installed or formed in the terminal and spaced apart from the ground layer; at least one switching unit interposed between the at least one conductor and the ground layer, the switching unit selectively connecting the conductor to the ground layer through an electrical connection unit; and a controller controlling the switching unit so that the conductor and the ground layer of the main board are selectively electrically connected together depending on a state of the terminal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
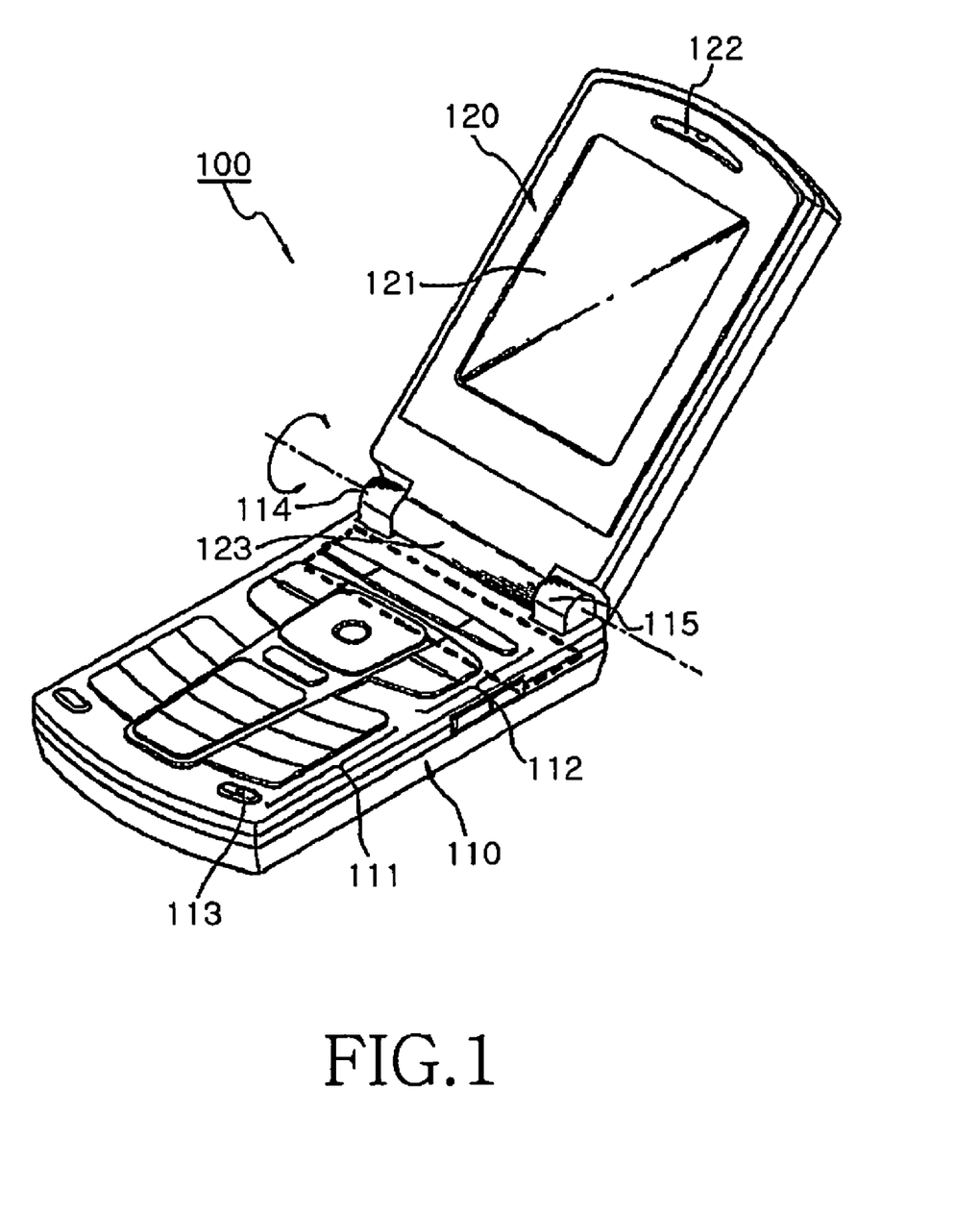
FIG. 1 is a perspective view of a portable terminal according to the present invention.
Figure 2:
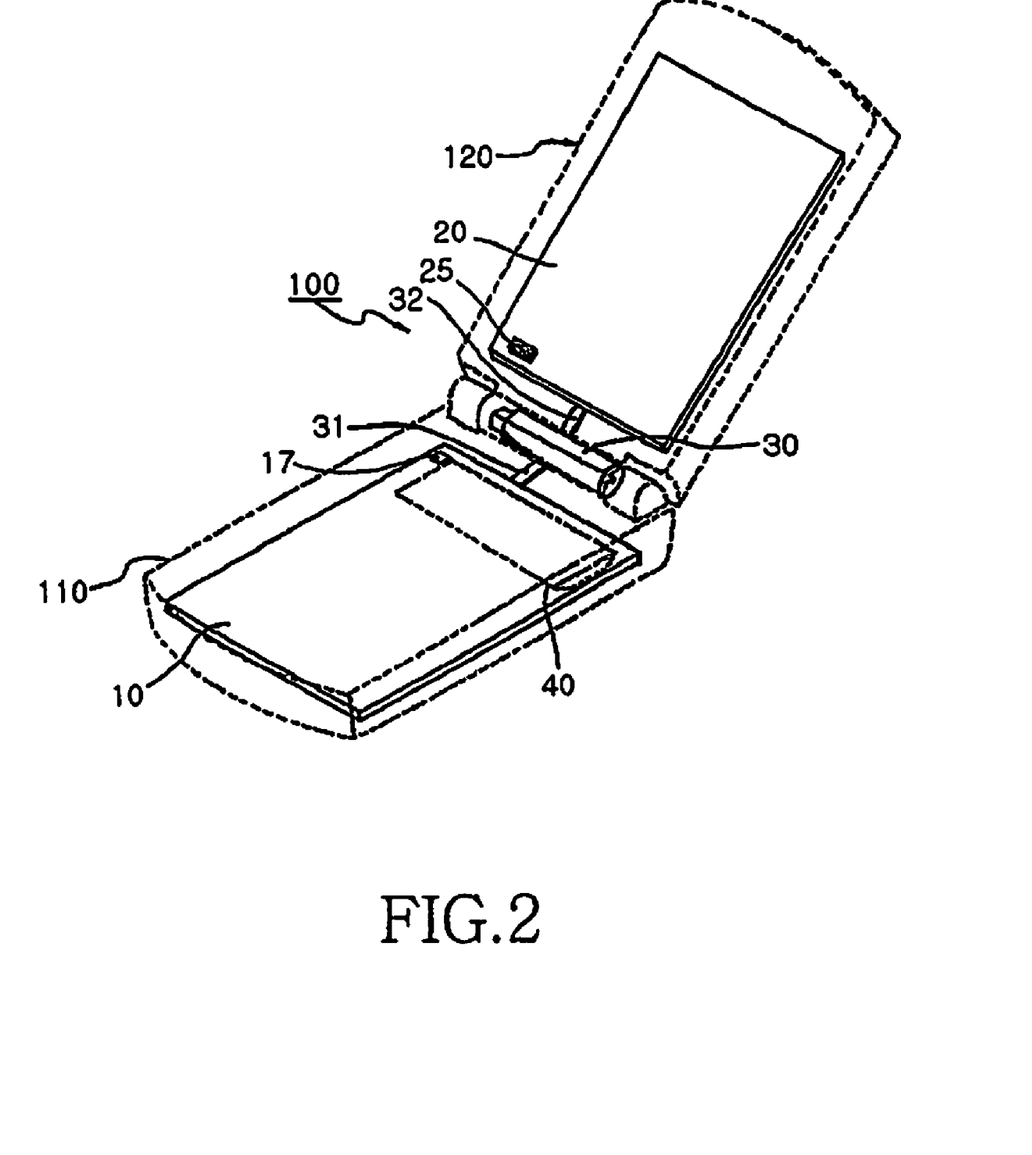
FIG. 2 illustrates an internal configuration of a portable terminal including a Hall sensor (e.g., Hall IC) according to the present invention.

A folder type terminal is described and illustrated in describing the present invention. However, the present invention is not limited thereto, but may be applied not only to a slide type terminal, a pop-up type terminal and a swing type terminal each including a sub-body being opened and closed in various manners but also to a bar type terminal FIG. 1 is a perspective view of a portable terminal according to the present invention. The portable terminal includes a main body 110, and a folder 120 being opened and closed with respect to the main body 110 at a predetermined angle. The main body 110 includes a plurality of key button assemblies 111 and 112. The plurality of key button assemblies 111 and 112 may include a 3×4 keypad assembly 111 and a navigation keypad assembly 112. A mic unit 113 is installed under the keypad assembly 111. Also, a built-in antenna (40 of FIG. 2) is installed at a portion of the main body 110 indicated by a dotted line of FIG. 1. The built-in antenna 40 may employ a predetermined planar radiator, but the radiator is not limited thereto and various types of antenna radiators may be installed. As illustrated in FIG. 2, the antenna may be mounted on a rear surface of a main board 10.

The folder 120 may include a display unit 121 of a predetermined size. The display unit 121 may be a Liquid Crystal Display (LCD) module. A speaker unit 122 is installed above the display unit 121.

The folder 120 is folded with the main body 110, pivoting on a portion where the folder 120 is coupled with the main body 110. The folder 120 includes a center hinge arm 123, and side hinge arms 114 and 115 respectively installed at both sides of the main body 110 and facing each other. The center hinge arm 123 receives therein a hinge module (30 of FIG. 2).

The hinge module is partially fixed to one of the side hinge arms 114 and 115 and interworks therewith, thereby allowing a user to sense opening and closing of the folder 120 and inducing a direction shift toward an opening or closing direction at a predetermined point of a folder movement. However, the hinge arms are not limited to the above description. If the center hinge arm 123 including the hinge module 30 is formed at the main body 110, the corresponding side hinge arms 114 and 115 may be formed at the folder 120.

FIG. 2 illustrates an internal configuration of a portable terminal including a Hall sensor (e.g., Hall IC) according to the present invention. The main board 10 is installed in the main body 110, and the built-in antenna 40 is installed on a rear surface of the main board 10. The built-in antenna 40 is grounded to a ground layer (12 of FIG. 3) of the main board 10 depending on a kind of the built-in antenna (e.g., in the case of a Planar Inverted F-Antenna (PIFA)).

A folder printed circuit board (hereinafter, referred to as a slave board) 20 is installed in the folder 120, and a second ground layer (22 of FIG. 3) is formed in a predetermined region of the slave board 20. An LCD module (21 of FIG. 3), a component of the display unit installed on the folder 120, may be mounted on the slave board 20.

Figure 3:
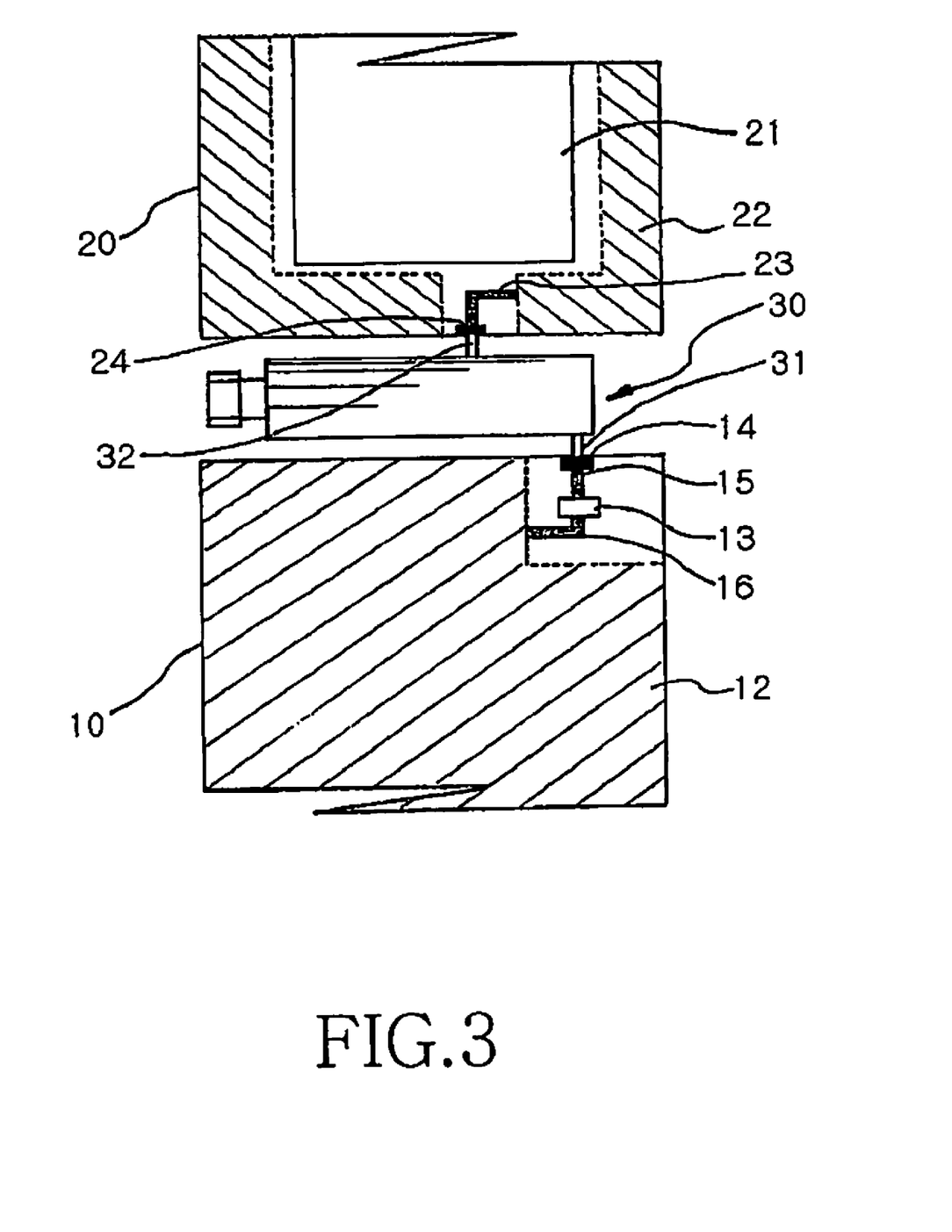
FIG. 3 illustrates a variable ground structure of a portable terminal according to an embodiment of the present invention.

The hinge module 30 serves not only as a medium that electrically connects the ground layer 12 of the main board 10 with the second ground layer 22 of the slave board 20 but also as a conductor to implement an expanded ground structure. Therefore, electrical connection units 31 and 32 may be respectively installed between the ground layer 12 of the main board 10 and the hinge module 30 and between the second ground layer 22 of the slave board 20 and the hinge module 30. For example, examples of the electronic connection units 31 and 32 may include a conductive metal pin, a conductive gasket, a Flexible Printed Circuit (FPC), and other well-known electrical connectors.

Although not shown, at least one component of the hinge module 30 may be formed of a conductor. As illustrated, a hinge housing constituting an exterior of the hinge module 30 is formed of a metallic material for an electrical connection in the present invention. However, the present invention is not limited thereto, and a hinge shaft, a hinge cam, and a hinge spring among well-known components of the hinge module 30 may be formed of a metallic material so that the entire hinge module 30 can be used as a ground layer. It is important to use the hinge module 30 as a medium by electrically connecting the electrical connection units 31 and 32 to the same component of the hinge module.

The terminal includes a sensor that detects whether the folder is opened or closed. A Hall sensor (e.g., Hall IC) 17 is used as the sensor. The Hall sensor 17 is mounted on a portion of the main board 10 in the form of a Surface Mounted device (SMD), and a magnet 25 having a magnetic force is installed at a portion of the folder 120 corresponding to the portion of the main board 10 where the Hall sensor 17 is installed. When the folder 120 is closed, the Hall sensor 17 detects the magnet 25, thereby detecting whether the folder 120 is opened or closed.

FIG. 3 illustrates a variable ground structure of a portable terminal according to an embodiment of the present invention. A ground layer 12 having a predetermined area is formed on the main board 10. Also, the slave board 20 of the folder 120 may be used as a second ground layer 22, excluding a portion where the LCD module 21 is mounted.

A predetermined switching unit 13 may be installed at a portion of the main board 10 where the ground layer 12 is not formed. One end of the switching unit 13 is electrically connected to a pattern 16 electrically connected to the ground layer 12, and the other end of the switching unit 13 is electrically connected to a conductive pad 14 by a predetermined pattern 15. The electrical connection unit 31 connected to the hinge module 30 is connected to the conductive pad 14. Consequently, the switching unit 13 is interposed in series between the electrical connection unit 31 connected to the hinge module 30 and the ground layer 12.

Likewise, a conductive pad 24 is formed at the slave board 20. The conductive pad 24 is electrically connected to the hinge module 30 by the electrical connection unit 32, and is electrically connected to the second ground layer 22 by a predetermined pattern 23.

If an internal space of the terminal is available, the switching unit 13 of the main board 10 may be implemented on a separate small printed circuit board. Well-known switching units such as a zener diode, an RF switch may be employed as the switching unit 13.

A terminal controller controls the switching unit 13 upon receiving a detection signal of the Hall sensor 17 detecting opening or closing of the folder 120. That is, the terminal controller detects the opening or closing of the folder 120 through the Hall sensor 17. Then, the terminal controller can vary a ground area by selectively electrically connecting the hinge module 30, the second ground layer 22 of the slave board 20, and the ground layer 12 of the main board 10 using the switching unit 13. Here, the grounding with the hinge module 30 may be set when a terminal provider initially couples antenna radiation characteristics of the terminal. When the folder 120 is closed, the grounding with the hinge module 30 may be disconnected using the switching unit 13, but may be performed when the folder 120 is opened in order to reduce SAR.

Figure 4:
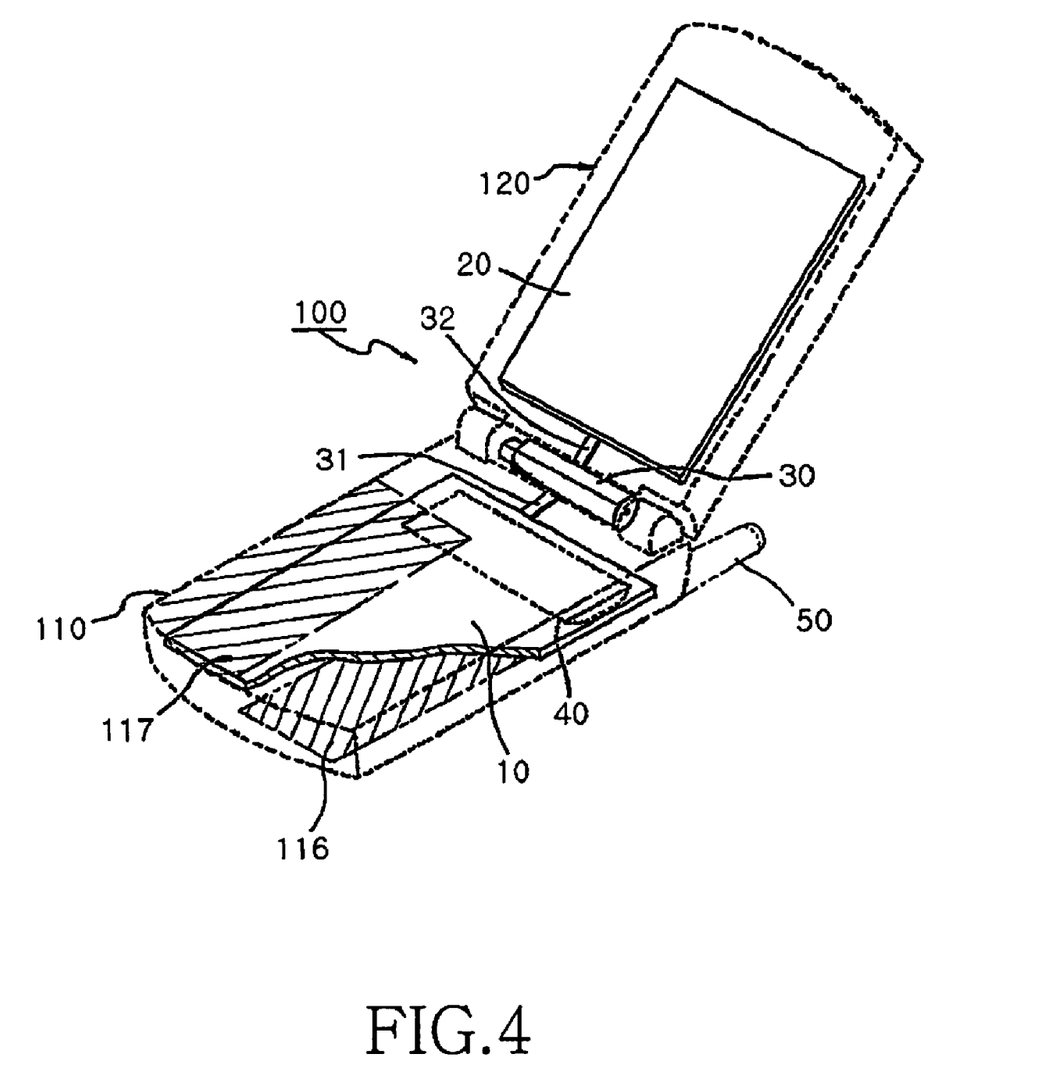
FIG. 4 illustrates an internal configuration of a portable terminal with a variable ground structure according to another embodiment of the present invention.

FIG. 4 illustrates an internal configuration of a portable terminal with a variable ground structure according to another embodiment of the present invention. The entire configuration is similar to that of FIG. 2, except that the electrical connection units 31 and 32 are electrically connected to the hinge module 300 all the time without any switching units, and additional ground bodies 116 and 117 are formed or installed at a case frame of the main body 100 in order to vary a ground area. In detail, as illustrated in FIG. 4, the first conductor 117 is installed or formed on the case frame of the main body 110, and the second conductor 116 is installed or formed under the case frame. One of the first conductor 117 and the second conductor 116 is electrically connected to the ground layer of the main board 110 all the time. The remaining conductor is selectively electrically connected to the ground layer under control of the terminal controller through a switching unit.

The terminal 100 illustrated in FIG. 4 is implemented to operate in dual bands. Therefore, two antennas 40 and 50 corresponding to the respective dual bands are provided, and include both an existing built-in antenna 40 and an external antenna 50. For example, the built-in antenna 40 may use an antenna radiator such as a Planar Inverted F Antenna (PIFA) to perform an optimum operation in a short-wavelength band of, for example, a PCS and CDMA. The external antenna 50 may be installed to advantageously operate in a long-wavelength band of, for example, a Terrestrial Digital Multimedia Broadcast (TDMB), Digital Video Broadcasting-Handheld (DVB-H).

Thus, the control of the switching unit for varying a ground area of the ground unit having a configuration illustrated in FIG. 4 is performed depending on a band change set by a user, not whether the folder is opened or closed.

Figure 5:
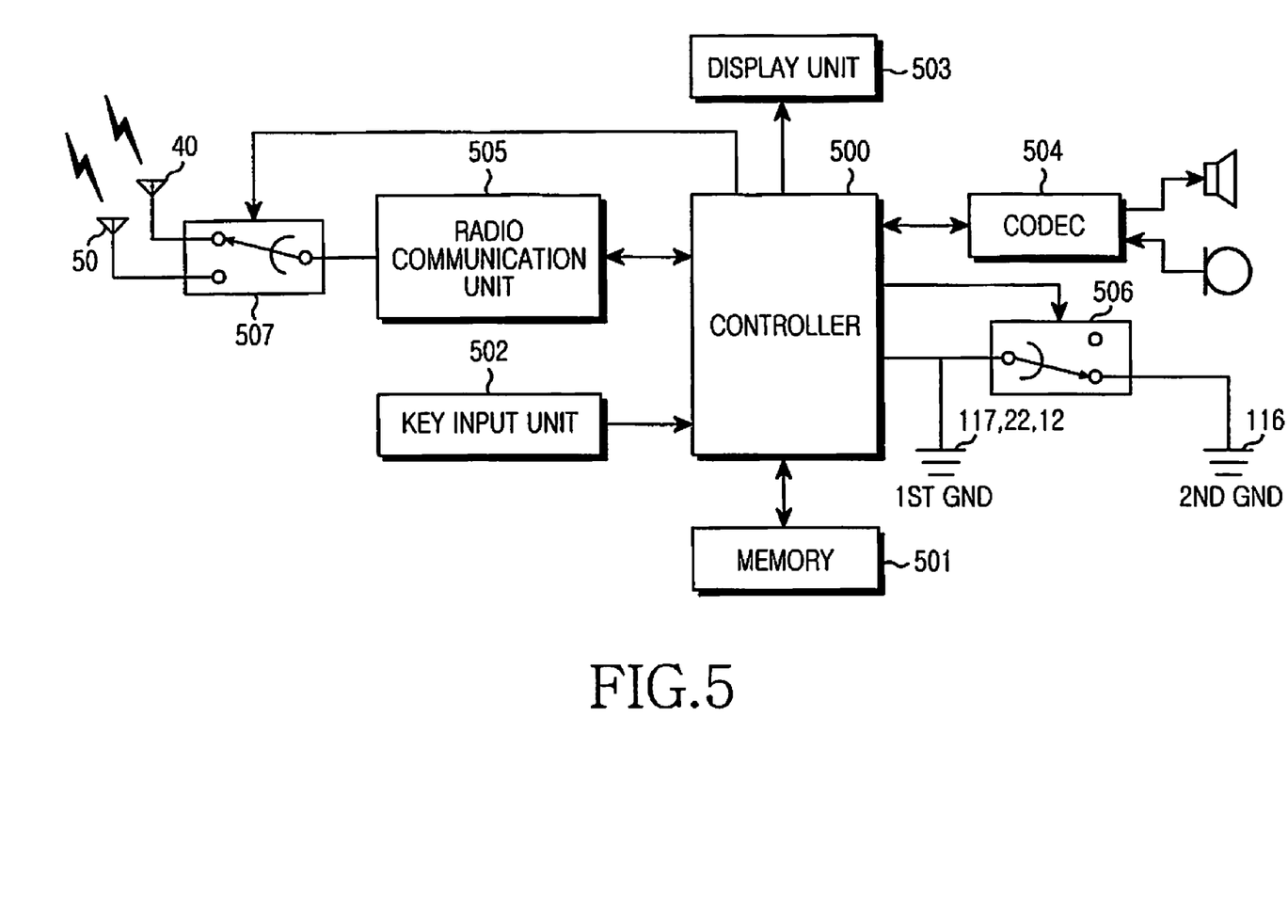
FIG. 5 is a block diagram of a portable terminal having a configuration illustrated in FIG. 4.

FIG. 5 is a block diagram of a terminal having the above-described configuration.

A controller 500 controls an overall operation of the terminal, and controls a switching unit 506 that selectively connects one separate conductor 116 installed according to the present invention to a ground layer of the main board 10. Also, the controller 50 may control another switching unit 507 that switches the antennas 40 and 50 to selectively operate in different bands depending on a mode setting of a user.

In the present invention, the ground layer 12 of the main board 10, the second ground layer 22 of the slave board 20, and the first conductor 117 are electrically connected to each other all the time, and only the second conductor 116 is selectively connected to the ground layer 12 of the ground board 10 by the predetermined switching unit 506. However, the present invention is not limited thereto, and a plurality of ground bodies may be selectively connected by a plurality of switching units, respectively when the terminal is used in multiple bands. That is, according to the present invention, a ground area may vary depending on a corresponding function of a terminal.

As the first and second ground bodies 116 and 117, various well-known conductors may be used selectively or together, such as an electromagnetic interference (EMI) spray coated on an inner surface of the case frame of the terminal, a planar metallic plate attached on the inner surface of the case frame, and a Flexible Printed Circuit (FPC) attached on the inner surface of the case frame.

The detailed description of a memory 501, a key input unit 502, a display unit 503, a radio communication unit 505, and a codec 504 will be omitted because those components are well-known components of the terminal.

Figure 6:
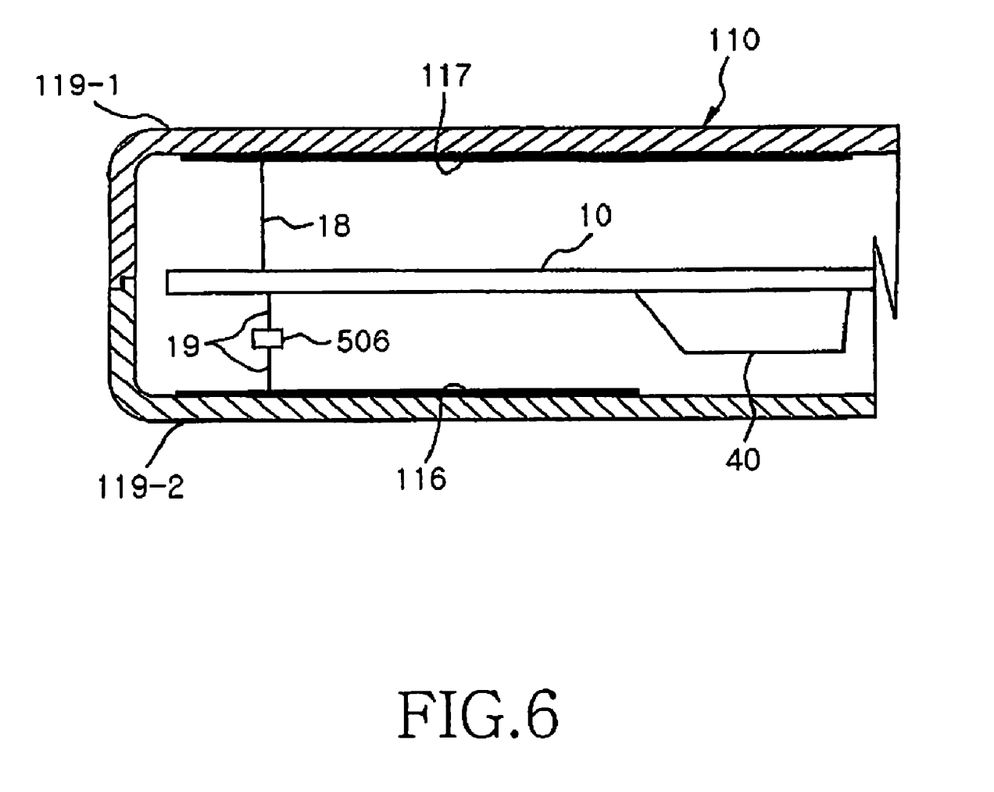
FIG. 6 is a sectional view illustrating a configuration of FIG. 4.

FIG. 6 is a cross-sectional view illustrating a configuration of FIG. 4. In FIG. 6, electrical connections between the first and second ground bodies 116 and 117 and the ground layer 12 of the main board 10 are illustrated in detail. In the drawing, the electrical connection units 18 and 19 may be a predetermined thin cable, or a flexible printed circuit. In the drawing, the switching unit 506 is spaced apart from the main board 10 for convenience sake of description, but the switching unit 506 may be installed at a location of the main board 10 where the ground layer 12 of the main board 10 is not formed. Thus, a portion of the electrical connection unit 19 may serve as a pattern that electrically connects the ground layer 12 of the main board 10 with the switching unit 506.

As illustrated in FIG. 6, the main body 110 includes an upper case frame 119-1 and a lower case frame 119-2. The first conductor 117 is installed or formed on the upper case frame 119-1, and the second conductor 116 is installed or formed on the lower case frame 119-2. The first conductor 117 is electrically connected to the main board 10 all the time, and the second conductor 116 is selectively connected to the main board 10 by the switching unit 506. The switching unit 506 is under control of the terminal controller.

Thus, for example, if the terminal operates in a relatively long-wavelength band of, for example, TDMA and DVB-H, a wide and long ground area is advantageous. Therefore, the controller 500 controls the switching unit 506 so that the second conductor 116 is electrically connected to the ground layer 12 of the main board 10. In contrast, if the terminal operates in a relatively short-wavelength band of, for example, PCS and CDMA, the switching unit 506 controls the switching unit 506 to open the second conductor 116 and the ground layer 12 of the main board 10, thereby reducing the ground area and thus achieving optimization.

Figure 7A:
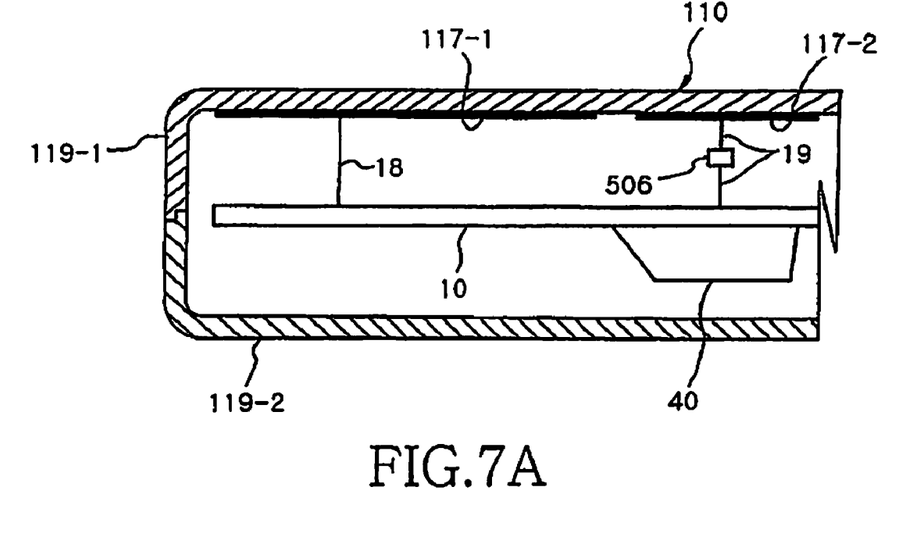
FIGS. 7A and 7B are cross-sectional views illustrating a portable terminal with a variable ground structure according to still another embodiment of the present invention.
Figure 7B:
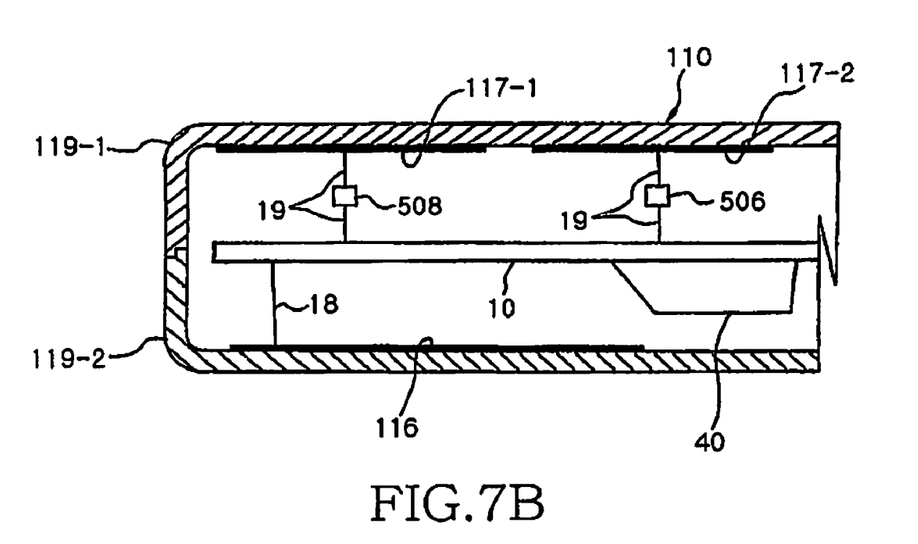

FIGS. 7A and 7B are cross-sectional views of a portable terminal with a variable ground structure according to still another embodiment of the present invention.

As illustrated in FIG. 7A, a first conductor 117-1 and a second conductor 117-2 are installed or formed on the same plane of the upper case frame 119-1 of the main body 110. The second conductor 117-2 may be selectively connected by the switching unit 506.

In FIG. 7B, an additional conductor 116 is further included. In detail, the first and second ground bodies 117-1 and 117-2 are installed on the upper case frame 119-1 of the main body 110, and may be selectively grounded by respective switching units 506 and 508. The third conductor 116 is installed or formed on the lower case frame 119-2, and may be electrically connected to the ground layer 12 of the main board 10.

According to the present invention, a desired ground area depending on an operational state (e.g., open/closed state, mode change, band change) of the terminal is obtained. Accordingly, an optimum antenna radiation characteristic can be achieved all the time, which contributes to implementing a high-end terminal.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A portable terminal with a variable ground unit, comprising:
   a main body receiving a main board including a ground layer having a predetermined area;
   at least one antenna radiator placed at the main board;
   a sub-body movably coupled to the main body by an electrically conductive hinge module and including at least one conductor electrically connected to the ground layer by the electrically conductive hinge module;
   at least one switching unit interposed between the at least one conductor and the ground layer, the at least one switching unit selectively connecting the at least one conductor to the ground layer by an electrical connection unit; and
   a controller controlling the at least one switching unit so that the at least one conductor and the ground layer of the main board are selectively electrically connected depending on a state of the terminal.

2. The portable terminal of claim 1, wherein the sub-body performs a predetermined opening and closing operation with respect to the main body.

3. The portable terminal of claim 2, further comprising a sensing unit for detecting opening and closing of the sub-body,
   wherein the controller controls the switching unit depending on whether the sub-body is opened or closed.

4. The portable terminal of claim 3, wherein the sensing unit is a Hall sensor installed at the main board, the Hall sensor detecting a magnetic force of a magnet installed at the sub-body.

5. The portable terminal of claim 4, wherein the sub-body is a folder, and the folder is opened and closed at a predetermined angle with respect to the main body by the electrically conductive hinge module.

6. The portable terminal of claim 5, wherein the at least one conductor is disposed on an inner surface of a case frame of the portable terminal, the case frame surrounding the main board.

7. The portable terminal of claim 6, wherein the at least one conductor is at least one of an electromagnetic interference spray coated to an inner surface of the case frame, a metallic plate attached to the inner surface of the case frame, and a flexible printed circuit.

8. The portable terminal of claim 7, wherein the electrical connection unit is at least one of a thin cable, a metallic gasket, a metallic plate, a flexible printed circuit, and a conductive tape.

9. The portable terminal of claim 5, wherein a second ground layer provided at a slave board of the folder is electrically connected to the electrically conductive hinge module.

10. The portable terminal of claim 4, wherein the portable terminal is a slide type portable terminal and the sub-body is a slide body sliding a predetermined distance on the main body in a length direction of the portable terminal.

11. The portable terminal of claim 10, wherein the at least one conductor is disposed on an inner surface of a case frame of the portable terminal, the case frame surrounding the main board.

12. The portable terminal of claim 11, wherein the at least one conductor is at least one of an electromagnetic interference spray coated to the inner surface of the case frame, a metallic plate attached to the inner surface of the case frame, and a flexible printed circuit.

13. The portable terminal of claim 12, wherein the electrical connection unit is at least one of a thin cable, a metallic gasket, a metallic plate, a flexible printed circuit, and a conductive tape.

14. The portable terminal of claim 10, wherein a second ground layer provided at a slave board of the slide body is electrically connected to the electrically conductive hinge module.

15. The portable terminal of claim 1, wherein the at least one switching unit is installed at a region of the main board where the ground layer of the main board is not formed, the switching unit being electrically connected to the ground layer by a predetermined pattern.

16. The portable terminal of claim 1, wherein the at least one switching unit is installed separately from the main board, the at least one switching unit being electrically connected to the ground layer of the main board by a predetermined cable.

17. The portable terminal of claim 1, wherein the portable terminal is a multi-band terminal operatable in different bands.

18. The portable terminal of claim 17, wherein the controller controls the at least one switching unit so as to selectively electrically connect the ground layer to the at least one conductor, depending on an applied band of the portable terminal.

19. The portable terminal of claim 18, wherein the at least one conductor is disposed on an inner surface of a case frame of the terminal, the case frame surrounding the main board.

20. The portable terminal of claim 19, wherein the at least one conductor is at least one of an electromagnetic interference spray coated to the inner surface of the case frame, a metallic plate attached to the inner surface of the case frame, and a flexible printed circuit.

* * * * *